United States Patent [19]

Kimmett

[11] 3,727,286

[45] Apr. 17, 1973

[54] ELECTRICAL SERVICING TOOL

[76] Inventor: James P. Kimmett, 703 Pierce St., Delphos, Ohio 45833

[22] Filed: Oct. 7, 1971

[21] Appl. No.: 187,367

[52] U.S. Cl. ....................29/203 H

[51] Int. Cl. ....................H01r 43/00, B25b 27/02

[58] Field of Search ....................29/203 H, 206, 203 HC, 29/203 HM, 203 HT

[56] References Cited

UNITED STATES PATENTS 3,377,689 4/1968 Kimmett....................29/203 H 3,443,297 5/1969 Lusby, Jr....................29/206 X

*Primary Examiner*—Thomas H. Eager

*Attorney*—Carl F. Schaffer et al.

[57] ABSTRACT

A device for securely gripping small electrical components mounted on a circuit board to facilitate removal thereof. The device includes a thin wall annular portion having an interior opening shaped to snugly receive the cross-section of the component by sliding it downwardly over the component toward the board and a releasable locking detent which slips under the component to prevent removal therefrom.

10 Claims, 5 Drawing Figures

INVENTOR:
JAMES P. KIMMETT.
BY Owen & Owen
ATT'YS

ELECTRICAL SERVICING TOOL

This invention relates to a repair tool useful for servicing or disassemblying small electrical components, such as transistors, from circuit boards. My prior U.S. Pat. No. 3,377,689 discloses a tool for removing electrical components from a circuit board which includes a device for gripping the component and a spring biased support for supporting the gripping means over the component and urging it away from the circuit board. The present invention relates to an improved gripping means which is capable of being securely fastened upon the component, which cannot be accidentally dislodged, and which is capable of slipping over and gripping the component with a minimum of lateral clearance on all sides of the component.

U.S. Pat. No. 3,443,297 discloses another type of a component extractor which, similar to the clamping device disclosed in my aforementioned U.S. Pat. No. 3,377,689, includes a pair of laterally moving jaws which clamp upon the component to be removed. A disadvantage of this type of component gripping means is that the jaws must be somehow held against unintended lateral opening by a lock means or other clamping device which requires a large amount of lateral space between the component to be removed and adjacent components on the board or the gripping device itself is apt to unintentionally slip off the component when forces away from the board are exerted upon the component. The lateral movement of the jaws or the lock means or clamping device take up too much space and thus render the tool useless in some applications on crowded circuit boards.

It is an object of the present invention to provide a gripping mechanism which can operate with a minimum amount of lateral clearance between the component to be removed and its adjacent components on the same board and, at the same time, will positively grip the component without chance of unintentional removal during the servicing operation on that board. Other objects and advantages of the present invention will be more fully understood from the following detailed description of the preferred embodiments thereof, with reference being made to the accompanying drawing in which.

Figure 1:
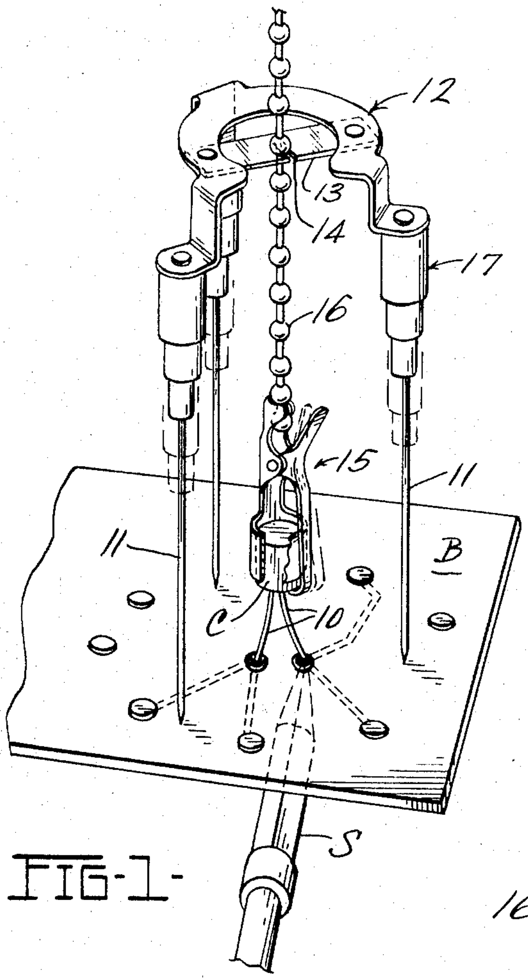
FIG. 1 is a view in perspective of an apparatus for removing an electrical component from a circuit board, showing the gripping device of the present invention.

Referring first to FIG. 1, a portion of a circuit board B is shown with an electrical component C, such as a transistor, mounted thereon. As is well known to those skilled in the art, such transistors are mounted on one side of the circuit board B with their leads, designated by reference number 10, extending through holes in the board with the ends of the leads 10 soldered on the lower surface of the board. The support stand for the gripping member of this invention is shown in FIG. 1 and is more fully explained in my aforementioned U.S. Pat. No. 3,377,689. Generally, the support stand includes a plurality of needle like legs 11 connected to a transverse support platform 12 having a central bar 13 with a narrow slot 14 positioned generally in the geometric center of the legs 11.

The component gripping device of this invention, generally designated by reference number 15 is attached at its upper end by a beaded line or chain 16 which may be placed in the slot 14 at any position along the length of the chain 16. As explained in my aforementioned U.S. Pat. No. 3,377,689, when the component gripping device 15 is attached to the component, the support platform 12 is placed over the component, the platform 12 is depressed towards the board by compressing telescoping areas 17 on the legs 11, and the chain 16 is slipped into the notch 14. This causes the component C to be urged away from the board B so that when the joint holding the leads 10 of the component C is softened, as by the soldering iron S, the component C will automatically spring away from the board.

Figure 2:
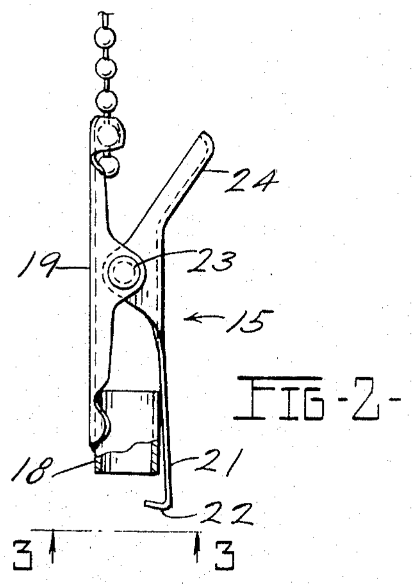
FIG. 2 is a view in elevation of the component gripping device of this invention.
Figure 3:
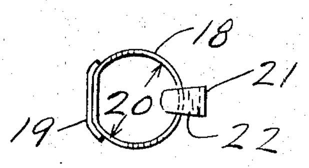
FIG. 3 is a cross-sectional view of the component gripping device, taken along line 3—3 of FIG. 2.

Referring to FIGS. 2 and 3, the gripping device of this invention consists of an annular portion 18 comprised of a thin wall sleeve of material attached on one side to an elongate handle 19. The annular portion 18, as best seen in FIG. 3, has an interior orifice or opening 20 whose cross-section is shaped to snugly receive the cross-section of the component to be removed, such as a transistor. It should be understood that each gripping member 15 is specifically designed for a type or series of transistors or other component so that the interior orifice 20 will snugly slip over that component as the gripping member 15 is moved over the component downwardly towards the board B. As shown in FIG. 3, if the transistor is generally cylindrical or canister shaped with a flat side, the interior orifice 20 of the gripping device 15 should be similarly shaped, but slightly larger so that it will snugly but freely slip completely over the transistor or other component.

Figure 4:
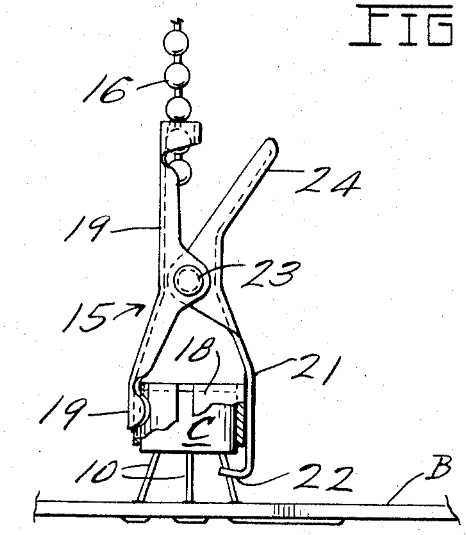
FIG. 4 is a view in elevation of the component gripping device of this invention, shown in position upon an electrical component mounted on a circuit board.

A locking member 21 having a detent 22 is pivotally attached to the handle 19 at a hinge 23 and has a lever 24 extending upwardly so that it may be selectively locked or unlocked by the operator, similar to the operation of a common alligator clip. It is preferably spring biased towards its closed position. When in locked position, as shown in FIGS. 2 and 4, the detent 22 extends below the annular portion 18 and within the extended area of the aperture 20 so that, when the device 15 is placed upon a component C, as best seen in FIG. 4, the detent 22 extends below the body of the component C so that upward removal is impossible unless the lock means 21 is released. Also, the detent 22 is at an acute angle to the member 21 so that, as the portion 18 is placed upon the component C and pushed downwardly towards the board B, the detent 22 will strike the top of the component and will automatically be forced to an open position until it snaps into locked position.

As best seen in FIG. 4, the point of attachment on the chain 16 to the gripping member 15 is on one side (to the left, as shown in FIG. 4) of the geometric axis of the orifice 20, while the locking member 21 and its detent 22 are on the other side (to the right, as shown in FIG. 4) of this geometric axis. When so positioned, an upward force on the chain 16 will cause a slight tilt or clockwise moment about the component so that the detent 22 will firmly seat on the bottom surface of the component C and the component C cannot escape the gripping device by slipping out or forcing the locking member 21 to unintentionally open.

Figure 5:
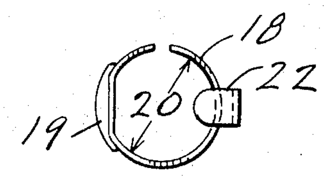
FIG. 5 is a cross-sectional view, similar to that of FIG. 3 but showing a modified form of the invention.

FIG. 5 shows a modified form of the gripping member of this invention which is similar to that previously described except that the annular portion 18 is open on one side so that the gripping member 15 may be slightly expanded to accommodate slightly larger components. In this embodiment, the annular portion 15 should be fabricated from spring steel to assure a sufficient clamping force on the component.

The use and advantages of the gripping member of this invention will be apparent from the above description. It can be seen that, because of the configuration of the annular portion 18, that a minimum of lateral clearance between the component to be removed and adjacent components on the board is required. Furthermore, when used in conjunction with the support platform shown in FIG. 1, components on an extremely crowded module circuit board of minature size can be gripped and the platform can be supported without damage or interference from other components. It will be apparent that a series of various sizes and shaped gripping members 15, adopted to fit all common transistors or other components, can be provided with a single support platform 12 as a repairman's tool kit, so that all commonly used components on a single board can be serviced with a single kit.

Various other modifications of the preferred embodiments described herein will be apparent to those skilled in the art and may be made without departing from the spirit and scope of the following claims.

I claim:

1. In an apparatus for removing electrical components from a circuit board including gripping means for attachment to the component to be removed and means for supporting said gripping means above such component and urging it away from said board, the improvement comprising a gripping member having a substantially annular portion with an interior orifice shaped to snugly receive the cross-section of the component to be removed by sliding said gripping member downwardly towards said board until said annular portion substantially surrounds said component, and releasable lock means secured on said gripping member for preventing removal thereof from said component.

2. The apparatus of claim 1 wherein said releasable lock means comprises a pivoted detent movable from an open position outside of said interior orifice of said gripping member to a closed position wherein said detent projects below said annular portion and within the extended area of said interior orifice to thereby extend beneath said component when in locked position.

3. The apparatus of claim 2 wherein said detent is spring biased towards its said closed position.

4. The apparatus of claim 1 wherein said annular portion comprises a thin walled sleeve extending entirely around said component.

5. The apparatus of claim 1 wherein said gripping member is secured to its said support means at a point above said gripping member and spaced away from the geometric axis of said interior orifice with said locking member spaced away from said geometric axis in the opposite direction from said support means.

6. A device for gripping an electrical component mounted on a circuit board comprising a gripping member having a substantially annular portion with an interior orifice shaped to snugly receive the cross-section of the electrical component by sliding said gripping member, and releasable lock means secured on said gripping member for preventing removal thereof from said component.

7. The device of claim 6 wherein said releasable lock means comprises a pivoted detent movable from an open position outside of said interior orifice of said gripping member to a closed position wherein said detent projects below said annular portion and within the extended area of said interior orifice to thereby extend beneath said component when in locked position.

8. The device of claim 7 wherein said detent is spring biased towards its said closed position.

9. The device of claim 6 wherein said annular portion comprises a thin walled sleeve extending entirely around said component.

10. The device of claim 6 wherein said gripping member is secured to its said support means at a point above said gripping member and spaced away from the geometric axis of said interior orifice with said locking member spaced away from said geometric axis in the opposite direction from said support means.

* * * * *